(12) United States Patent
Drechsler et al.

(10) Patent No.: US 7,127,686 B2
(45) Date of Patent: Oct. 24, 2006

(54) METHOD FOR VALIDATING SIMULATION RESULTS OF A SYSTEM AS WELL AS EQUIVALENCE COMPARISON OF DIGITAL CIRCUITS BASED ON SAID METHOD

(75) Inventors: Rolf Drechsler, Bremen (DE); Wolfgang Günther, München (DE); Burkhard Stubert, München (DE)

(73) Assignee: Onespin Solutions GmbH, Munich (DE)

( * ) Notice: Subject to any disclaimer, the term of this patent is extended or adjusted under 35 U.S.C. 154(b) by 163 days.

(21) Appl. No.: 10/488,631

(22) PCT Filed: Aug. 29, 2002

(86) PCT No.: PCT/EP02/09640

§ 371 (c)(1),
(2), (4) Date: Oct. 12, 2004

(87) PCT Pub. No.: WO03/021366

PCT Pub. Date: Mar. 13, 2003

(65) Prior Publication Data

US 2005/0043935 A1 Feb. 24, 2005

(30) Foreign Application Priority Data

Sep. 3, 2001 (DE) ................. 101 43 101

(51) Int. Cl.
*G06F 17/50* (2006.01)

(52) U.S. Cl. .............. 716/4; 716/2; 716/6; 716/18

(58) Field of Classification Search .............. 716/2, 716/4, 5, 6, 18; 703/14
See application file for complete search history.

(56) References Cited

U.S. PATENT DOCUMENTS

| | | | |
|---|---|---|---|
| 5,867,399 A | 2/1999 | Rostoker et al. | |
| 5,870,588 A | 2/1999 | Rompaey et al. | |
| 6,154,719 A | 11/2000 | Saitoh et al. | |
| 6,848,088 B1 * | 1/2005 | Levitt et al. | 716/4 |
| 2004/0025127 A1 * | 2/2004 | Takenaka | 716/5 |

OTHER PUBLICATIONS

International Preliminary Examination Report from PCT/EP02/009640, filed Aug. 29, 2002.

* cited by examiner

*Primary Examiner*—Thuan Do
(74) *Attorney, Agent, or Firm*—Brinks Hofer Gilson & Lione

(57) ABSTRACT

The invention creates a technology for validating simulation results. The quickly growing number of components in modern complex systems often necessitates the introduction of abstractions, that render said systems manageable. However the abstractions, which often are based simplified assumptions, may impair the simulation results. The automatic post-processing method according to the invention safeguards the validity of the result. In most cases this can be reached, without restoring the complete description, which generally is too complex. The method, which is described for the validation of calculated counter-examples in an equivalence comparison of digital circuits can be used in all other applications, that allow for an analagous formalization of the abstraction step.

19 Claims, 2 Drawing Sheets

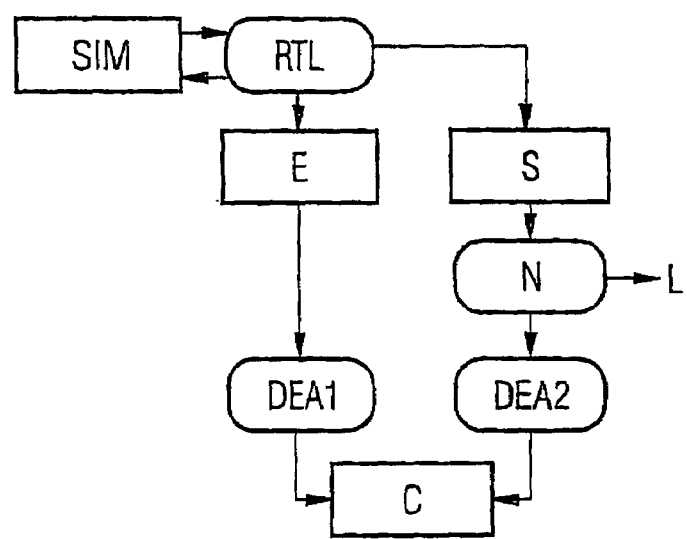
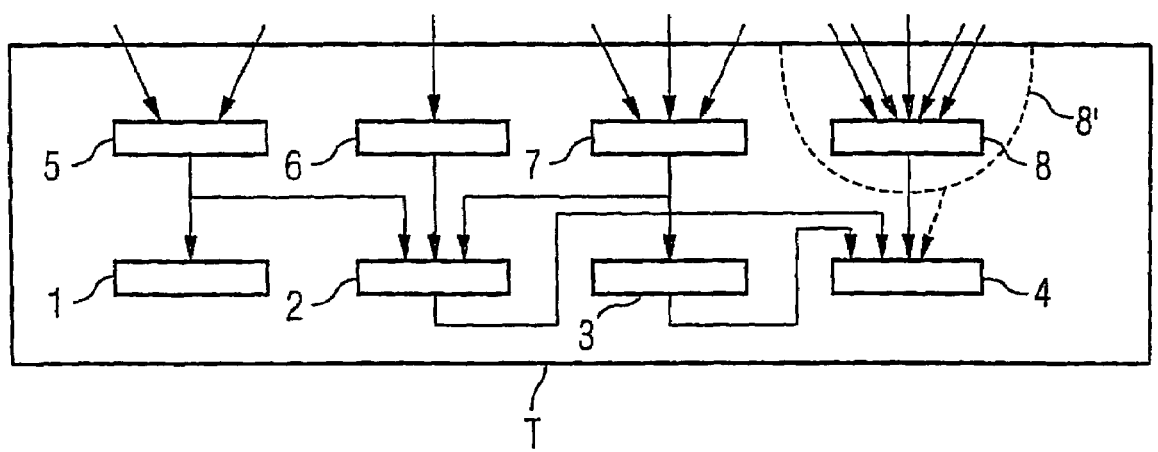

_METHOD FOR VALIDATING SIMULATION RESULTS OF A SYSTEM AS WELL AS EQUIVALENCE COMPARISON OF DIGITAL CIRCUITS BASED ON SAID METHOD_

PRIORITY AND CROSS REFERENCE TO RELATED TO APPLICATIONS

This application is related to and claims the benefit of priority under 35 U.S.C. §§ 120, 371 and 365 to international application number PT/EP02/09640, filed on Aug. 29, 2002, which was published as international publication number WO 03/021366 A1 in German.

This application is further related to and claims the benefit of priority under 35 U.S.C. § 119 to the filing date of German patent application number DE 101 43 101.5 filed Sept. 3, 2001.

The invention relates to a method for validating simulation results of a system, whereby this system is divided into a plurality of abstraction levels of varying complexity, as well as a method for the equivalence comparison of digital circuits based on said method, whereby each digital circuit is described by a plurality of state variables as well as input variables initially assumed as freely assignable.

As a result of the quickly growing complexity of modern, for example microelectronic systems it often happens that the number of components, for example transistors or logic gates exceeds several million. As an example at this stage reference is made to computer-assisted circuit design, since present layouts here often consist of up to 20 million transistors.

The ability to manage these systems efficiently necessitates the introduction of abstraction levels. Based on an initial idea more and more details are added, until a complete description develops.

Figure 1:
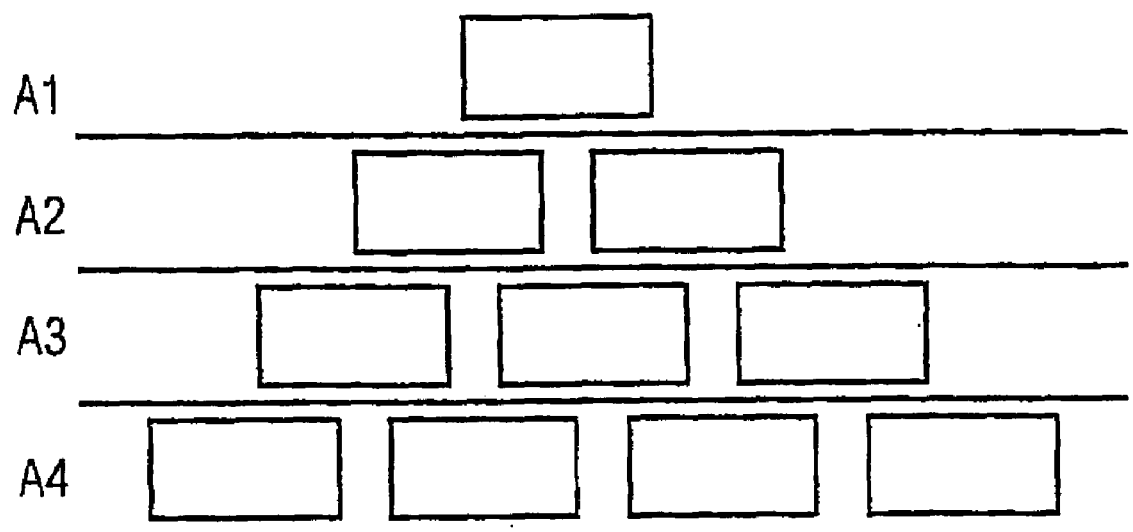

The refinement in the example of circuit layout from specification to realization in gates and/or transistors is indicated in FIG. 1, where a system with four abstraction levels A1 . . . A4 is shown. The term "refinement" in this case is applied in an obvious way from top to bottom. The layers arising are also called levels.

The abstraction level A1 describes the specification, while the abstraction levels A2 and A3 describe further refined abstract models of the system. The lowest abstraction level A4 finally exhibits the highest degree of detail, the system being described on a level of the components such as gates, transistors etc. The abstraction level A4 is therefore the most complex.

This procedure of refinement is also called 'top down development', starting from the specification up to realization of gates and/or transistors. This description however can contain so much information that in many places simplification is again necessary. Since however the actual description again becomes remote through the simplification, it must be ensured that and/or in what way the results, which were obtained for the higher abstraction level, also apply to those lying further below.

In principle a distinction is made between two abstraction methods:

information-obtaining abstraction:

The description is simplified and therefore reduced in complexity, however the information content is not impaired with regard to the targets observed. That is to say all results obtained on higher abstraction levels are directly transferable. For example in the case of electronic circuits if statements about the logical behaviour are made, technology-specific information such as power consumption can be ignored.

information-reducing abstraction:

The description is simplified in the way that details are omitted and the information content is reduced with regard to the problem. This procedure generally allows for greater reductions.

However it must always be checked consequently whether the results are transferable to the next abstraction level. Here a great deal of "manual work" is usually necessary, since the results must be verified in individual steps and transferred to the level lying below. Thus it can be stated that it is often necessary due to the quickly growing number of components in modern complex systems to introduce abstractions, which render the systems for simulation purposes manageable. However these abstractions, which often are based on simplified assumptions, may impair the simulation results.

An object of the present invention is it to create a method for automatically validating the simulation results of such technical systems.

The inventors have now recognized that the simulation results, which cause the differences on higher abstraction levels, only concern a small part of the level lying below. Based on this realization the relevant part of the system is automatically extracted according to the invention.

In the present invention this is achieved by the method of the type initially described being further developed to the extent that an automatic post-processing method for validating a simulation result is carried out. This is achieved by a part of the system, in each case activated and therefore relevant for the simulation, being automatically extracted, whereby the abstraction level, on which the simulation was carried out, serves as the basis for reducing complexity. This abstraction level is only broken down locally in activated places of a lower abstraction level of the system and corresponding higher-complex system information is included, whereby validation only concerns the extracted, relevant part of the system.

Therefore the following advantages amongst others arise:

during the simulation phase the description can be handled on a high abstraction level. Therefore complexity is reduced and the description can be managed more easily;

validation only concerns the relevant part and, according to experience, this only relates to a small part of the overall system. Complete break down of the level is avoided.

Therefore the advantages of both perspectives are combined, since on the one hand complexity is reduced and on the other hand the quality of the result is not impaired.

A system S is divided by several refinements into abstraction levels $S_i$, whereby $S_1$ is the highest and $S_n$ the lowest. Thus $S_{i-1}$ results from $S_i$ through abstraction. In the illustration according to FIG. 1 the specification A1 corresponds to the level $S_1$ and the gate and/or transistor level A4 to the level $S_n$. The final results must be indicated for the level $S_n$, however in the case of complex systems frequently too many details than would permit this description to be handled efficiently have to be considered on this level.

Example: In the case of the description of digital circuits modeling at transistor level is only possible in the case of small circuits with approx. 1000 components. By virtue of the simplified assumption to describe the circuits on the basis of 0 and 1, simulations with several million transistors can be carried out.

However it must be considered, whether an information-obtaining or an information-reducing abstraction is concerned. This technology is frequently used, in order to increase efficiency on higher levels. However in this case it must be ensured in a post-processing step that the simulation results also apply to the lower level.

A similar situation results if individual components in a complex system are tested independently of the whole. If wrong behaviour, which is highlighted by simulation, occurs it must be subsequently checked whether the component in question would show the same behaviour during interaction with the other parts of the system.

Example: A traffic light consists of three lamps with the colours red, yellow and green. If the lamps are tested individually, it is possible that the red and the green lamp light up at the same time. If the lamps are later integrated into the complete system, this situation is prevented by means of a control circuit.

As well as the abstraction therefore the results, which are gained from local observation, must also be handled with care accordingly. Only one evaluation in the overall system under consideration of the later environment provides information.

The basic concept of the invention therefore is local deviation from the abstraction levels, in order on the one hand to validate the simulation results on the lower levels but on the other hand to keep the complexity of the system simple and transparent. With regard to simulation runs in general not all parts of the system are concerned. The activated part and thus that relevant for simulation is automatically extracted and at this stage the abstraction level is broken down locally.

This is shown in the illustration according to FIG. 2, where the local deviation step is designated with L, the abstract model A3 now also including an activated information unit I4 of the transistor and gate level A4 lying below. Thus it is ensured that all the information is available, in order to also check the simulation results for validity on levels further below. On the other hand the complexity reduction obtained by abstraction can be applied to large parts of the system.

Based on this fundamental concept of the invention a further method for equivalence comparison of digital circuits is proposed, whereby each digital circuit is described by a plurality of state variables as well as input variables initially assumed as freely assignable and whenever a difference is found, a counter-example is generated, which is validated for proving inequivalence, by an attempt being made to initially prove, on the basis of simulations, reachability of the counter-example, by searching for a sequence of samples, which stops the assignment necessary for this sample based on completely unspecified state variables, and if this does not succeed in proving the non-reachability of this counter-example as the result of an over approximation, in particular on the basis of a BDD (Binary Decision Diagram) analysis, by iteratively determining previous states, from which the target states can be reached, on the basis of the possible target states of the counter-example and adding to a quantity of states for such time until no further new states can be added, whereby non-reachability is the case, if not all states in the quantity of states were reached and therefore the target states of the counter-example cannot be reached by each starting state.

It has been shown to be particularly advantageous if the reachability of the counter-example is proven on the basis of random sample simulations, by initially assigning all state variables with an indefinite value (care don't) and iteratively determining subsequent states, by biasing the input variables of the digital circuit with random values for such time until the desired target state of the counter-example is reached or a specified number of iterations is exceeded.

Alternatively the reachability of the counter-example can also be proven on the basis of evolutionary algorithms.

According to an advantageous embodiment non-reachability is proven as a result of over approximation, by extracting a relevant part of the system of the counter-example, whereby a partial circuit is generated, by limitation to such difficult state variables, which always or often remain at an indefinite value taking place, whereby in the event of non-reachability of the partial circuit, non-reachability of the entire counter-example is concluded.

In this case it has proved to be further advantageous if limitation to such difficult state variables takes place, by reducing the counter-example by all or part of such state variables, which frequently assume the demanded target state of the counter-example.

If a reduction of the counter-example takes place by state variables, which frequently assume the demanded target state of the counter-example, by virtue of the fact that these are set to an indefinite value, this can be achieved particularly simply and therefore effectively.

Such state variables, which frequently assume the demanded target state of the counter-example, can be determined particularly advantageously on the basis of a random sample simulation as described above.

Alternatively for proving non-reachability the over approximation can take place by extracting a relevant part of the system of the counter-example, whereby a partial circuit is generated, by replacing state variables with input variables, whereby in the event of non-reachability of the partial circuit, non-reachability of the entire counter-example is concluded.

According to an advantageous embodiment of this alternative, such state variables are incrementally substituted with variables, which on the basis of all state variables, that lie within the sphere of influence of the counter-example, depend on the greatest number of variables.

It has proven particularly effective if an over approximation initially takes place in accordance with the possibility, initially demonstrated, of carrying out an over approximation and, if still no non-reachability could be proven in this way, a further over approximation in accordance with the alternative over approximation described above takes place, whereby such state variables, which are assigned in the counter-example, are not substituted with input variables.

If the degree of the over approximation can be specified, by varying the number of state variables to be substituted, further possibilities result for carrying out the method according to the invention, which allow for flexibility of the application and further optimization.

A first advantageous embodiment results, if a maximum degree of over approximation initially occurs, which is gradually reduced.

In addition during experiments with the invention the following sequence of an over approximation has proven particularly advantageous, whereby this is continued for such time until non-reachability is proven:

ignore 75% of the counter-example and substitute all other state variables, ignore 75% of the counter-example and substitute 75% of the other state variables, ignore 75% of the counter-example and substitute 25% of the other state variables, ignore 75% of the counter-example and substitute no other state variables, use the entire counter-example and substitute all other state variables and use the entire counter-example and substitute no other state variables.

It is also advantageous if information, which is obtained when proving the reachability of the counter-example, is used for accelerating the subsequent, especially BDD-based, non-reachability analysis.

The method according to the invention for equivalence comparison of digital circuits can be improved further, by compressing the counter-example prior to the reachability analysis of the counter-example generated. This is achieved by assigning for each state variable and each input variable with not indefinite value an indefinite value with this value, whereupon this state variable or input variable is eliminated, whenever the difference determined between the digital circuits to be checked continues to arise for such time until no further reduction is possible.

A preferred use of the method according to the present invention therefore lies in verifying the logic in computer-assisted circuit design. Thus the invention can be realized preferably with a computer system encompassing software modules, with which the process steps described above are implemented in accordance with the invention, if these software modules are implemented on the computer system.

Therefore with the aid of the invention the validity of the simulation result can be safeguarded on the basis an automatic post-processing method. This is achieved in most cases, without restoring the complete description, which generally is too complex. The method described here in the example of validating calculated counter-examples in an equivalence comparison of digital circuits is also applicable in all other applications, that allow for an analagous formalization of the abstraction step.

Figure 2:
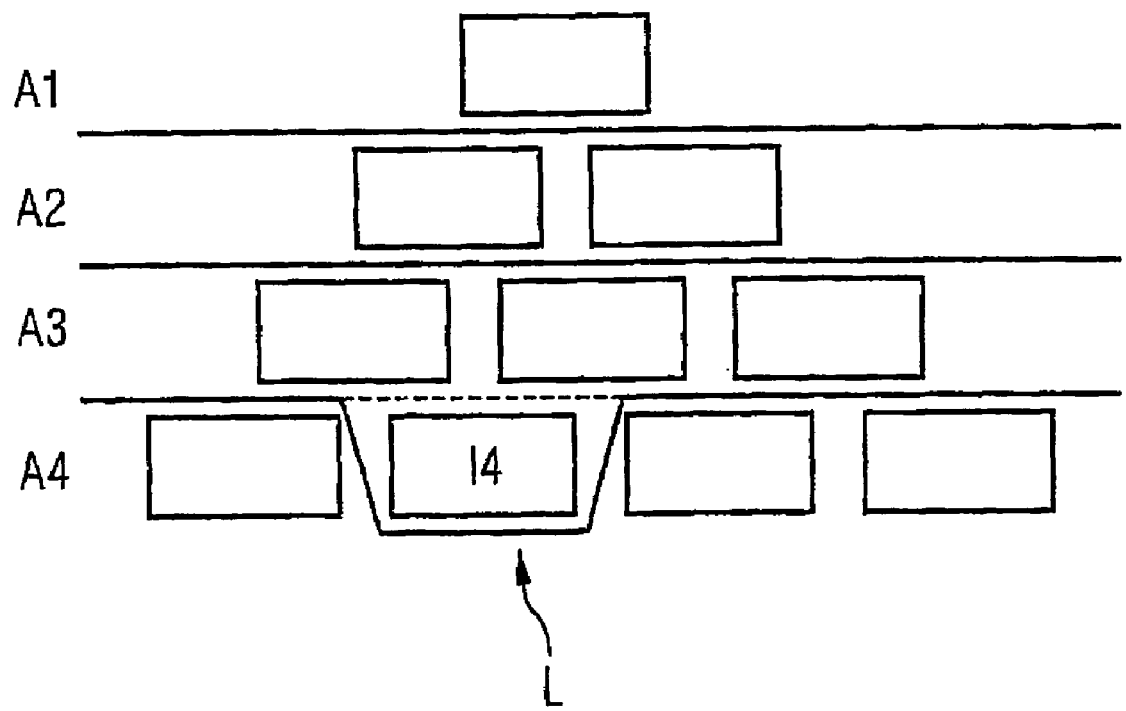

Further details and advantages of the invention will be apparent from the detailed embodiment described below and in conjunction with the drawings, wherein:

FIG. 1 division of a technical system into abstraction levels;

FIG. 2 local break down of an abstraction level of the technical system shown in FIG. 1;

FIG. 3 a flow chart for illustrating the procedure in the case of equivalence comparison of two digital circuit descriptions;

FIG. 4 example of an over approximation by replacing state variables with inputs.

The invention will be described in detail below on the basis of a concrete embodiment for validating counter-examples in computer-assisted circuit design.

The descriptions are possible both on a register transfer level RTL and on a gate level. Comparisons in principle can be made between the respective levels, that is to say RTL description against RTL description, RTL description against gate network list or two gate network lists against one another.

Based on the conceptual idea and an RTL description, in the case of the circuit layout a corresponding gate network list is generated, on the basis of which a layout synthesis is made.

As a result of so-called 'property checking' it can be verified whether a layout meets the characteristics demanded. Consequently it is frequently necessary to make corrections, which are also called 're-design'. Here equivalence comparison can be used in order to show the equality between two RTL descriptions. In a next step the correctness of the synthesis is verified (RTL description against gate network list). At the end some further changes have to made to the network list, for example by integrating test logic. In addition further changes are usually necessary at the last minute, so-called 'engineering change orders'. These steps can also be verified by equivalence comparison. In this case two gate network lists are compared with one another here. Often simulation runs lasting several days can be saved as a result of this procedure.

The functionality of a circuit is checked by equivalence comparison. In the illustration in accordance with FIG. 3 a typical verification scenario is shown on the basis of a flow chart, which results in the case of the RTL against gate level description, in order to permit better understanding of the problem. The correctness of the synthesis step can be proven by comparing the RTL description and the network list. Based on an RTL input RTL, for example obtained from a SIM simulation, a network list, which serves for the layout synthesis L, is produced by synthesis. Based on the RTL description RTL a corresponding model of a deterministic finite automat DEA1 is performed through an extraction E.

Likewise such a model of a deterministic finite automat DEA2 is derived from the synthesis network list N. The two models DEA1 and DEA2 are now checked for equivalence in a further step C.

It is now demonstrated on the basis of such a computer-assisted circuit design how the method according to the invention described above can be used for equivalence comparison. As a preliminary remark reference is briefly made to the difference between combinatorial circuits and switching devices.

combinatorial circuit: a combinatorial circuit can be described by a Boolean function.

switching device: a switching device also possesses storage elements. The behaviour of switching devices can be described by the deterministic finite automatons (DEA), already mentioned, in English linguistic usage better known as 'finite state machines' FSM.

If interest is only in the combinatorial description, a switching device can be easily transformed by the following abstraction into a combinatorial circuit: the switching device is separated along the storage components, also called state variables below. Thus new inputs and outputs for the circuit arise. The advantage of this abstraction lies in the simplification of the description, since now only the logical behaviour must be observed. Temporal behaviour is ignored.

Therefore however it may happen that simulation results, which are computed for the combinatorial circuit are not permissible in the switching device description. This can result from the non-reachability of states in the DEA.

Therefore, in order to validate the simulation results, the reachability of the states must be proven and/or their non-reachability shown.

It would be pointless to observe the entire switching device. However modern circuits can possess a very large number of more than 150,000 state variables, which correspond to a state quantity of more than $2^{150000}$. With the methods in existence today such a quantity cannot be analyzed efficiently.

All usual tools for equivalence comparison of digital circuits, which are applied to complete ASIC's (Application Specific Integrated Circuits) with several million gates, therefore make the simplified assumption described above. Through this abstraction the assumption is implicitly made that each state of the DEA describing the switching device can be reached, since the state variables transformed to inputs are freely assignable.

The tools for equivalence comparison therefore initially generate a counter-example, whenever a difference can be recognized. This counter-example must then be proven as reachable or non-reachable.

The method according to the invention for validating counter-examples, which are determined by means of equivalence comparison, now consists of the following steps:
1. Compaction of the counter-examples (optional)
2. Analysis of reachability through
2a. Simulation-based reachability analysis and if necessary
2b. BDD based proof of non-reachability These steps will now be described in detail. The method described below was successfully implemented and tested in several cases relevant to reality.

Compaction of the counter-examples

In practice the counter-examples generated are frequently over-specified, that is to say more input and/or state variables are used than are necessary for proving, inequivalence. Since the aim of the method is only to observe the areas, which are necessary for proof, attempt is made to reduce the length of the counter-examples.

In order to keep the running time short, a heuristic is therefore inserted, which on the basis of the counter-example using a trivalent simulator, attempts to assign indefinite values, so-called don't cares dc with specified values.

This takes place, by assigning for each state variable and each input variable with not indefinite value dc an indefinite value dc with this value, whereupon this state variable or input variable is eliminated whenever the difference determined between the digital circuits to be checked continues to arise, for such time until no further reduction is possible. For this purpose each specified input is selected in sequence and set to a non-specified value. If the following trivalent simulation still provides the same result, the value is left unspecified, otherwise it is re-set. Whenever the difference continues to be observed in this way, the sample is reduced. This process is iterated, until no further reduction is possible.

Reachability Analysis

The reachability analysis is divided into two steps. Initially, since this is the less complex step, attempt is made to prove the reachability. If this does not succeed, a method of providing proof is started, which attempts to demonstrate non-reachability.

Simulation-Based Reachability Analysis

The reachability of a counter-example is proven, if a sequence of samples can be found, which stops the assignment necessary for the sample based on completely unspecified state variables in the switching device. Random samples are simulated in a possible implementation.

Likewise good results can be achieved, the simulation is controlled by additional information, as is done by employing 'evolutionary algorithms' for example. Such 'evolutionary algorithms' are for example described in the publication: R. Drechsler. Evolutionary Algorithms in VLSI CAD, Kluwer Academic Publisher, 1998. This publication is incorporated by reference.

BDD Based Proof of Non-Reachability

A direct method for proving non-reachability can be implemented by means of a BDD based reachability analysis. The abbreviation BDD in this case stands for 'Binary Decision Diagram'. This technology was proposed at the beginning of the 90's and is extensively described in: J. R. Burch, E. M. Clarke, K. L. McMillan, D. L. Dill; Sequential circuit verifications using symbolic model checking, Design Automation Conference, P. 46–51, 1990.

The basic algorithm is indicated in the following:

```
BackwardReachability (counter-example ce)
    {newStates = targetStates = ce
    WHILE (targetStates ≠ all states) {
        previousStates = getPreviousStates (targetStates)
        newStates = previousStates \ targetStates
        IF (newStates = ∅)
            RETURN "not reachable"
        targetStates = targetStates ∪ newStates
    }
    RETURN "ce is reachable"
}
```

Initially it must be differentiated whether the analysis is carried out on the transition relation or directly on the state transition function. Also a combination is possible. In order to reduce the complexity, partitioning concepts were presented, which in each case only observe one part of the states (see for example the work of Burch et al, cited above). Nevertheless large layouts cannot be handled even with this. The principal reasons are the BDD sizes
- of the transition function or
- of the target states (see "targetstates" in the basic algorithm illustrated above).

In both cases the BDD size is the limiting factor. Therefore two techniques according to the invention are indicated below, which attempt to prove non-reachability.

Limitation to Difficult States

According to the random sample simulation discussed above it is already clear that there are state variables, which often assume the value demanded in the counter-example, while other variables always remain at the "don't care dc" value. Therefore the "don't care dc" values are observed initially, since it is probable here that these variables can never be assigned with the correct values. Even if this is only demonstrated for part of the variables, the non-reachability of the entire counter-example is a direct consequence of this.

At this point it is evident that one is now between the two abstraction levels selected previously, thus the abstraction levels are broken down locally, since both the sequential aspect of the switching device (for the difficult states) is observed as well as the simplification of the abstraction that all "non-difficult" states are treated as freely assignable inputs.

This method is an over approximation, that is to say if non-reachability is proven for the partial circuit generated, the total circuit can be concluded. Otherwise no statement is obtained.

Substitution of State Variables with Inputs

A further over approximation, which can be seen as a generalization of the above method, is the selection of state variables, which are replaced with inputs. This procedure is illustrated in FIG. 4, which shows a partial circuit T with state variables in the form of registers 1 to 4 of the counter-example and with further state variables and/or registers 5 to 8 within the sphere of influence of the counter-example. Inputs are indicated in the form of arrows, which point to the respective registers. As an example the register 8, which lies in the level above the counter-example and thus within the sphere of influence of the counter-example, is replaced by an input 8'.

Substitution takes place incrementally. Based on all state variables 5 to 8, which lie within the sphere of influence of the counter-example (transitive fanin cone) those, which depend on the greatest number of variables (see register 8 with five inputs), are selected. As a result the BDD size can be quickly reduced but there are other selection criteria, which may be used.

State variables, which are assigned in the counter-example, are never replaced, since this is already observed by the method described above. Nevertheless the resultant circuit can still always exhibit sequential behaviour, even though all variables are replaced, for example if there are state variables, which depend on themselves.

The sequence of the procedure according to the invention, briefly summarized, is therefore as follows: on the basis of random sample simulations attempt is made initially to prove the reachability of a counter-example. Then the above BDD based methods are used.

These can be started with various parameters, which indicate the degree of the over approximation, by varying the number of state variables to be substituted.

In this case the following sequence of an over approximation, which is carried out according to the following sequence until non-reachability is proven, has proved to be particularly successful:

- ignore 75% of the counter-example and substitute all other state variables,
- ignore 75% of the counter-example and substitute 75% of the other state variables,
- ignore 75% of the counter-example and substitute 25% of the other state variables,
- ignore 75% of the counter-example and substitute no other state variables,
- use the entire counter-example and substitute all other state variables and
- use the entire counter-example and substitute no other state variables.

The method described was implemented and used several times in connection with the validation of counter-examples. As an example a module with 2843 inputs, 4178 outputs and 150215 state variables was used. The circuit consisted of over 1.9 million gates. A complete reachability analysis was not possible with BDD techniques. However as a result of the over approximations of counter-examples described, non-reachability could be proven in less than a CPU second. The large amount of time saved by the user as a result of this is obvious.

The invention claimed is:

1. Method for equivalence comparison of digital circuits, whereby each digital circuit is described by a plurality of state variables as well as input variables and output variables initially assumed as freely assignable and whenever a difference is found, a counter-example is generated, which is validated for proving inequivalence, by attempt being made,
    to prove initially on the basis of simulations, reachability of the counter-example, by searching for a sequence of samples, which stops the assignment necessary for this sample based on completely unspecified state variables, and
        if this does not succeed in proving non-reachability of this counter-example by an over approximation, by iteratively determining on the basis of the possible target states of the counter-example previous states, from which the target states can be reached, and adding to a quantity of states for such time until no further new states can be added, whereby non-reachability is the case, if not all the states in the quantity of states were reached and therefore the target states of the counter-example cannot be reached by each starting state.

2. Method for equivalence comparison of digital circuits according to claim 1, whereby the over approximation takes place on the basis of a BDD (Binary Decision Diagram)—analysis.

3. Method for equivalence comparison of digital circuits according to claim 1, whereby the reachability of the counter-example is proven on the basis of random sample simulations, by initially assigning all state variables with an indefinite value and by iteratively determining subsequent states, by biasing the input variables of the digital circuit with random values for such time until the desired target state of the counter-example is reached or a specified number of iterations is exceeded.

4. Method for equivalence comparison of digital circuits according to claim 1, whereby the reachability of the counter-example is proven on the basis of evolutionary algorithms.

5. Method for equivalence comparison of digital circuits according to any one of claims 1 to 4, whereby for proving the non-reachability the over approximation takes place by extracting a relevant part of the system of the counter-example,
    whereby a partial circuit is generated, by a limitation to such difficult state variables, which always or often remain at an indefinite value, taking place
    whereby in the case of non-reachability of the partial circuit, non-reachability of the entire counter-example is concluded.

6. Method for equivalence comparison of digital circuits according to claim 5, whereby the counter-example is divided into a plurality of abstraction levels of varying complexity and whereby the abstraction level, on which a simulation was carried out, serves as the basis for reducing complexity and this abstraction level is only broken down locally in relevant places of a lower abstraction level of the counter-example and corresponding higher-complex system information of the counter-example is included, whereby validation only concerns the relevant part of the system of the counter-example extracted.

7. Method for equivalence comparison of digital circuits according to claim 5, whereby a limitation to such difficult state variables takes place, by reducing the counter-example by all or part of such state variables, which frequently assume the demanded target state of the counter-example.

8. Method for equivalence comparison of digital circuits according to claim 7, whereby a reduction of the counter-example by the state variables, which frequently assume the demanded target state of the counter-example, takes place by virtue of the fact that these are set to an indefinite value.

9. Method for equivalence comparison of digital circuits according to claim 7, whereby such state variables, which frequently assume the demanded target state of the counter-example, are determined on the basis of a random sample simulation.

10. Method for equivalence comparison of digital circuits according to claim 1, whereby for proving non-reachability the over approximation takes place, by extracting a relevant part of the system of the counter-example, whereby a partial circuit is generated, by replacing state variables with input variables, whereby in the case of non-reachability of the partial circuit, non-reachability of the entire counter-example is concluded.

11. Method for equivalence comparison of digital circuits according to claim 10, whereby such state variables are incrementally substituted with input variables, which on the basis of all state variables, that lie within the sphere of influence of the counter-example, depend on the greatest number of variables.

12. Method for equivalence comparison of digital circuits according to claim 10, whereby the degree of over approximation can be specified, by varying the number of state variables to be substituted.

13. Method for equivalence comparison of digital circuits according to claim 1, whereby a first over approximation according to claim 5 takes place and, if still no non-reachability could be proven, a further over approximation according to claim 9 takes place, whereby such state variables, which are assigned in the counter-example, are not substituted with input variables.

14. Method for equivalence comparison of digital circuits according to claim 13, whereby a maximum degree of over approximation initially takes place, which is gradually reduced.

15. Method for equivalence comparison of digital circuits according to claim 13, whereby the following sequence of an over approximation is used until non-reachability is proven:

ignore 75% of the counter-example and substitute all other state variables, ignore 75% of the counter-example and substitute 75% of the other state variables, ignore 75% of the counter-example and substitute 25% of the other state variables, ignore 75% of the counter-example and substitute no other state variables, use the entire counter-example and substitute all other state variables and use the entire counter-example and substitute no other state variables.

16. Method for equivalence comparison of digital circuits according to claim 1, whereby information, which is obtained when proving reachability of the counter-example, is used for accelerating the subsequent non-reachability analysis.

17. Method for equivalence comparison of digital circuits according to claim 1, whereby compression of the counter-example precedes the reachability analysis of the counter-example generated, by assigning for each state variable and each input variable with not indefinite value, an indefinite value with this value, whereupon this state variable or input variable is eliminated whenever the difference determined between the digital circuits to be checked continues to arise, for such time until no further reduction is possible.

18. Use of the method according to claim 1 for verifying the logic in computer-assisted circuit design.

19. Computer system, which comprises software modules, with which the method in accordance with claim 1 is implemented on the computer system.

* * * * *